United States Patent [19]

Schwalm et al.

[11] Patent Number: 5,318,876
[45] Date of Patent: Jun. 7, 1994

[54] RADIATION-SENSITIVE MIXTURE CONTAINING ACID-LABILE GROUPS AND PRODUCTION OF RELIEF PATTERNS

[75] Inventors: Reinhold Schwalm, Wachenheim; Horst Binder, Lampertheim; Dirk Funhoff, Heidelberg, all of Fed. Rep. of Germany

[73] Assignee: BASF Aktiengesellschaft, Ludwigshafen, Fed. Rep. of Germany

[21] Appl. No.: 862,949

[22] Filed: Apr. 3, 1992

[30] Foreign Application Priority Data

Apr. 8, 1991 [DE] Fed. Rep. of Germany ....... 4111283

[51] Int. Cl.$^5$ .......................... G03G 1/73; G03G 5/56; G03F 7/039
[52] U.S. Cl. .................................. 430/270; 430/326; 430/914; 430/921; 522/59; 522/31
[58] Field of Search ............... 430/270, 910, 326, 921, 430/914, 917; 522/31, 59

[56] References Cited

U.S. PATENT DOCUMENTS

| | | | |
|---|---|---|---|
| 3,915,706 | 10/1975 | Limburg et al. | 96/27 R |
| 3,923,514 | 12/1975 | Marsh | 96/35 |
| 4,678,737 | 7/1987 | Schneller et al. | 430/270 |
| 4,883,740 | 11/1989 | Schwalm et al. | 430/270 |
| 5,069,998 | 12/1991 | Schwalm et al. | 430/270 |
| 5,118,582 | 6/1992 | Ueno et al. | 430/270 |

FOREIGN PATENT DOCUMENTS 388813 9/1990 European Pat. Off. .

OTHER PUBLICATIONS

*Microelectronic Engineering,* Bd. 13, No. 1/4, Mar. 1991, pp. 33–36, Schlegel et al.: "Highly Sensitive Positive Deep UV Resist Utilizing a Sulfonate Acid Generator and a Tetrahydropyranyl Inhibitor" (to be submitted later).
SPIE, vol. 1262, Advances in Resist Technology and Processing VII (1990) pp. 26–31.
J. Polymer Sci., Chem. Edition, vol. 18, pp. 1021–1034 (1980).

*Primary Examiner*—Marion E. McCamish
*Assistant Examiner*—Rosemary Ashton
*Attorney, Agent, or Firm*—Keil & Weinkauf

[57] ABSTRACT

A radiation-sensitive mixture which contains
(a) a polymeric binder which is insoluble in water but soluble in aqueous alkaline solutions and
(b) an organic compound whose solubility in an aqueous alkaline developer is increased by the action of an acid and which contains one or more groups cleavable by an acid and in addition a group which forms a strong acid under the action of radiation, and additionally
(c) an alkyl- or arylsulfonate of a hydroxyaromatic, is suitable for the production of relief patterns.

10 Claims, No Drawings

RADIATION-SENSITIVE MIXTURE CONTAINING ACID-LABILE GROUPS AND PRODUCTION OF RELIEF PATTERNS

The present invention relates to positive-working radiation-sensitive mixtures which contain a binder which is soluble in aqueous alkaline media, a compound which contains one or more bonds cleavable by an acid and forms a strong acid under the action of radiation, the solubility of the compound in an alkaline solvent being increased by the action of the acid, and further compounds which improve the shelf life or the processing latitude. These mixtures are sensitive to UV, electron and X radiation and are particularly suitable as resist materials.

Positive-working radiation-sensitive mixtures are known. Positive-working resist materials which contain o-quinonediazides in aqueous alkaline binders, for example novolaks, are used commercially as photoresists, so that the processes for the production of relief images are also known. However, the sensitivity of these systems to radiation is unsatisfactory in some cases.

For this reason there have been developed radiation-sensitive systems which, in the primary photochemical reaction, produce a species which then initiate a catalytic secondary reaction independently of the radiation and hence dramatically increase the sensitivities. Such systems which produce a strong acid photochemically which then cleaves acid-labile groups in a secondary reaction are disclosed in, for example, U.S. Pat. Nos. 3,932,514 and 3,915,706 and in DE-A-34 06 927.

Examples of known compounds of this type which produce an acid photochemically are onium salts, halogen compounds, nitrobenzylsulfonates and sulfonates of phenols (cf. Proceedings of the International Symposium on Polymers for Microelectronics (1990) for positive resists, and SPIE, Advances in Resist Technology and Processing VII, page 26 et seq. (1990) for negative resists). In the article on the positive resists, the advantages of the sulfonates over the onium salts are described; for example, it is stated that the positive resist formulations become negative-working on overexposure by a factor of from 2 to 3 when onium salts are used but show no negative behavior even on overexposure by a factor of 10 when the sulfonates are used.

Furthermore, DE-A 37 21 741 proposes radiation-sensitive mixtures which contain a polymeric binder soluble in aqueous alkaline solutions and an organic compound whose solubility in an aqueous alkaline developer is increased by the action of an acid and which contains one or more groups cleavable by an acid, the organic compound producing a strong acid under the action of radiation.

A disadvantage of all these systems is their sensitivity to storage times between the exposure step and the subsequent process of the secondary reaction for cleavage of the acid-labile groups, which is generally promoted by heating. Relatively long storage times between the exposure step and heating after exposure lead in general to longer development times or nondevelopable resist layers.

It is an object of the present invention to provide radiation-sensitive mixtures by means of which photoresists based on acid-catalyzed reactions, in particular photosensitive positive-working coating materials, consisting of a binder which is soluble in aqueous alkaline solutions and an organic compound which contains one or more bonds cleavable by an acid and a group which forms a strong acid under the action of radiation, can be processed to give relief patterns, making possible a processing latitude suitable in practice, in particular with regard to storage times between exposure and heating steps permitted.

We have found, surprisingly, that this object is very advantageously achieved by the novel mixtures.

The present invention relates to a radiation-sensitive mixture containing (a) a polymeric binder which is insoluble in water but soluble in aqueous alkaline solutions and
(b) an organic compound whose solubility in an aqueous alkaline developer is increased by the action of an acid and which contains one or more groups cleavable by an acid and in addition a group which forms a strong acid under the action of radiation, which is defined in that the radiation-sensitive mixture additionally contains (c) one or more organic compounds of the general formula (I)

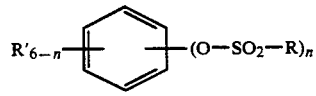

(I)

where R is alkyl of 1 to 8 carbon atoms, haloalkyl of 1 to 8 carbon atoms, aryl of 6 to 18 carbon atoms or alkyl-, halogen- or $NO_2$-substituted aryl, the radicals R' are identical or different and are each hydrogen, alkyl of 1 to 8 carbon atoms, alkoxy of 1 to 8 carbon atoms or

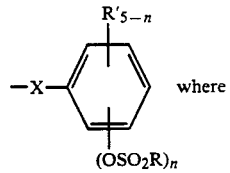

where

X is —O—, —S— or —$(-CR''_2)_m$—, R'' is H, alkyl of 1 to 4 carbon atoms or halogen, n is 1, 2 or 3 and m is from 0 to 8.

Preferred radiation-sensitive mixtures are those which contain polymeric binders (a) based on homo- or copolymers of p-hydroxystyrene and/or p-hydroxy-ω-methylstyrene. Particularly suitable copolymer units are hydroxystyrenes which are mono- or disubstituted in the o-position with respect to the hydroxyl group or hydroxystyrenes whose phenolic group is protected by acid-labile groups.

Preferred organic compounds (b) are sulfonium salts of the general formula (II)

(II)

where $R^1$, $R^2$ and $R^3$ are identical or different and are aliphatic and/or aromatic radicals which may contain hetero atoms, or two of the radicals $R^1$ to $R^3$ are bonded to one another to form a ring, with the proviso that one or more of the radicals $R^1$ to $R^3$ contains one or more groups cleavable by an acid, and one of the radicals $R^1$ to $R^3$ may be bonded to one or more further sulfonium salt radicals, if necessary via groups cleavable by an acid, and $X^\ominus$ is a nonnucleophilic counter-ion.

Preferred organic compounds of the general formula (I) are the alkyl sulfonates of pyrocatechol, resorcinol, hydroquinone, pyrogallol, phloroglucinol and hydroxyhydroquinone.

The present invention furthermore relates to a process for the production of relief patterns and relief images, wherein a novel radiation-sensitive mixture is used and is preferably heated to 60°-120° C. after exposure.

The novel radiation-sensitive mixtures make possible the production of relief patterns and relief images having high resolution in conjunction with processibility suitable in practice and sufficiently large processing latitude, in particular with acceptable storage times (>10 minutes) between exposure and heating step.

Furthermore, the sensitivity of the systems is very high owing to the catalytic action of the photochemically produced acids, and very high contrast is obtained. These radiation-sensitive mixtures are therefore very suitable for use in deep UV lithography.

Regarding the components of the novel radiation-sensitive mixture, the following can be stated specifically.

(a) In a particularly preferred embodiment, the polymeric binder (a) essentially consists of polymers based on homo- or copolymers of p-hydroxystyrene and/or p-hydroxy-α-methylstyrene. Particularly suitable co-monomer units are hydroxystyrenes which are mono- or disubstituted in the o-position with respect to the hydroxyl group or hydroxystyrenes whose phenolic group is protected by acid-labile groups. Particularly preferred acid-labile groups are tert-alkyl carbonates, such as tert-butyl carbonates or tert-amyl carbonates, ethers and acetals, such as tert-butyl ether or tetrahydropyranyl ether, and tert-butyl esters. The polymers generally have average molecular weights $\overline{M}_w$ of from 2,000 to 100,000, preferably from 10,000 to 30,000.

The polymeric binder (a) is present in the novel mixture in general in an amount of from 55 to 99, preferably from 70 to 97, % by weight, based on the sum of the components (a) to (c).

(b) Particularly preferred organic compounds (b) are those of the general formula (II)

where $R^1$, $R^2$ and $R^3$ are identical or different and are aliphatic and/or aromatic radicals which may contain hetero atoms, or two of the radicals $R^1$ to $R^3$ are bonded to one another to form a ring, with the proviso that one or more of the radicals $R^1$ to $R^3$ contains one or more groups cleavable by an acid, preferably tert-butyl carbonates of phenols or silyl ethers of phenols, and one of the radicals $R^1$ to $R^3$ may be bonded to one or more further sulfonium salt radicals, if necessary via groups cleavable by an acid, and $X^\ominus$ is a nonnucleophilic counter-ion.

Preferred counter-ions are complex metal halides, such as tetrafluoroborate, hexafluoroantimonate or hexafluoroarsenate, and anions of strong organic acids, such as trifluoromethanesulfonate or fluorosulfonate.

It is also possible for two or more sulfonium units in the molecule to be bonded via the radicals $R^1$ to $R^3$.

Preferred sulfonium salts of the general formula (II)

are those in which $R^1$ and $R^2$ are each methyl and $R^3$ is a substituted phenyl derivative having acid-cleavable groups, for example

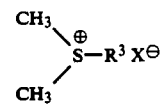

where $R^3$ is, for example, 4-tert-butoxycarbonyloxyphenyl, 4-tert-butoxycarbonyloxy-3,5-dimethylphenyl, 4-tert-butoxycarbonyloxy-3-methylphenyl, 4-tert-butoxycarbonyloxy-2-methylphenyl, 4-tert-butoxycarbonyloxy-3,5-dimethoxyphenyl, 4-tert-butoxycarbonyloxy-3,5-diphenylphenyl, 1-tert-butoxycarbonyloxynaphthyl, 4-trimethylsilyloxyphenyl or 4-trimethylsilyloxynaphthyl, or those in which two of the radicals $R^1$ to $R^3$ are bonded to one another to form a ring, in particular a five-membered or six-membered ring, where, for example, $R^1$ and $R^2$ are bridged to form, for example, tetramethylene groups and $R^3$ has the same meanings as above:

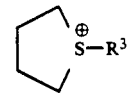

or compounds in which $R^1$ is methyl and $R^2$ is phenyl or tolyl and $R^3$ is a substituted phenyl derivative having acid-cleavable groups, such as

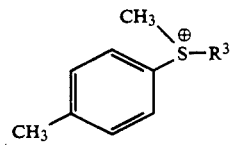

where $R^3$ is 4-tert-butoxycarbonyloxyphenyl, 2,4-di-tert-butoxycarbonyloxyphenyl, 4-tert-butoxycarbonyloxy-2-methoxyphenyl or 4-trimethylsilylphenyl, or where $R^1$ is phenyl or $C_1$-$C_{12}$-alkyl-substituted phenyl or halogen-substituted phenyl and $R^2$ and $R^3$ are each a substituted phenyl derivative having acid-cleavable groups, for example

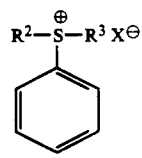

where $R^2$ and $R^3$ are each, for example, 4-tert-butoxycarbonyloxyphenyl, 4-trimethylsilyloxyphenyl, 4-tert-butyldimethylsilyloxyphenyl or 4-tert-butoxycarbonyloxy-3,5-dimethylphenyl or $R^1$, $R^2$ and $R^3$ are identical, i.e. sulfonium salts (b) which contain three of these radicals having acid-cleavable groups.

Other suitable compounds of the general formula (II) are those in which one of the radicals $R^1$ to $R^3$ is bonded to one or more further sulfonium salt radicals, if necessary via groups cleavable by an acid, i.e. compounds which likewise have a plurality of sulfonium groups in the molecule, for example

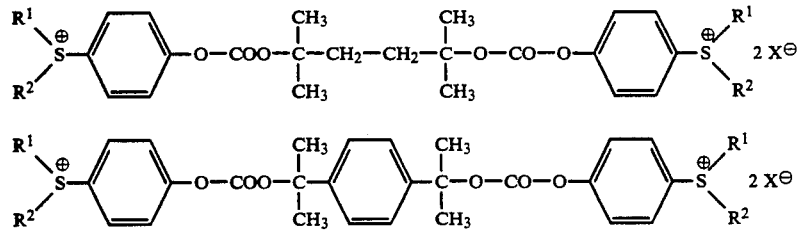

The organic compounds (b) can be prepared by the known methods of organic chemistry for the synthesis of esters, ethers and carbonates, by starting from the sulfonium salts having phenolic groups and derivatizing them in a corresponding manner. Sulfonium salts having phenolic groups can be reacted with potassium tert-butylate, after which the acid-cleavable group can be introduced using di-tert-butyl dicarbonate, or alternatively the phenolic sulfonium salt can be reacted with an activated carbonyl compound, for example tert-butoxycarbonyl-N-imidazole. Hydroxyphenylsulfonium salts which already contain a nonnucleophilic anion, e.g. hexafluoroantimonate, are particularly suitable for this reaction. Such compounds can be prepared, for example, by a synthesis method described in J. Polym. Sci., Chem. Ed. 18 (1980), 1021. For example, the compounds thus prepared can be dissolved in dry tetrahydrofuran, potassium tert-butylate in dry tetrahydrofuran can be added and a solution of di-tert-butyl dicarbonate in tetrahydrofuran can then be added dropwise. After working up and recrystallization, the pure sulfonium salts having acid-labile groups are obtained.

Preferred examples of organic compounds (b) are dimethyl-4-tert-butoxycarbonyloxyphenylsulfonium salts with hexafluoroarsenate, hexafluoroantimonate, hexafluorophosphate, hexafluoroborate or trifluoromethanesulfonate as a counter-ion, phenyl-bis-(4-tert-butoxycarbonyloxyphenyl)-sulfonium salts with the stated counter-ions, tris-(4-tert-butoxycarbonyloxyphenyl)sulfonium salts with the stated counter-ions or 1-naphthyl-4-trimethylsilyloxytetramethylenesulfonium salts with the stated counter-ions.

The organic compounds (b) are present in the novel mixture in general in an amount of from 0.5 to 20, preferably from 2 to 15, % by weight, based on the sum of components (a) to (c).

(c) Suitable organic compounds are sulfonates of the general formula (I)

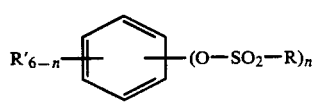

(I)

where R is alkyl of 1 to 8 carbon atoms, for example methyl, ethyl, propyl, isopropyl, butyl, isobutyl, pentyl, hexyl or 2-ethylhexyl, haloalkyl of 1 to 8 carbon atoms, such as mono-, di- or trichloromethyl or trifluoromethyl, aryl of 6 to 18 carbon atoms, for example phenyl or naphthyl, aryl which is substituted by alkyl (of 1 to 8 carbon atoms), by halogen (e.g. fluorine, chlorine or bromine) or by $NO_2$, such as alkylphenyl, halophenyl or nitrophenyl, the radicals R' are identical or different and are each hydrogen, alkyl of 1 to 8 carbon atoms, for example as stated under R, haloalkyl of 1 to 8 carbon atoms, for example trifluoromethyl or mono-, di- or trichloromethyl, alkoxy of 1 to 8 carbon atoms, for example methoxy, ethoxy, propoxy or butoxy, or

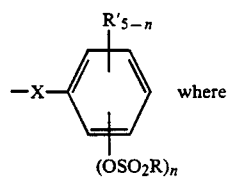

where

X is —O—, —S— or —(—CR"$_2$)$_m$—, R" is H, alkyl of 1 to 4 carbon atoms, e.g. methyl, or halogen, e.g. fluorine, n is 1, 2 or 3 and m is from 0 to 8.

Preferred organic compounds (c) are alkylsulfonates and arylsulfonates of hydroxyaromatics, for example:

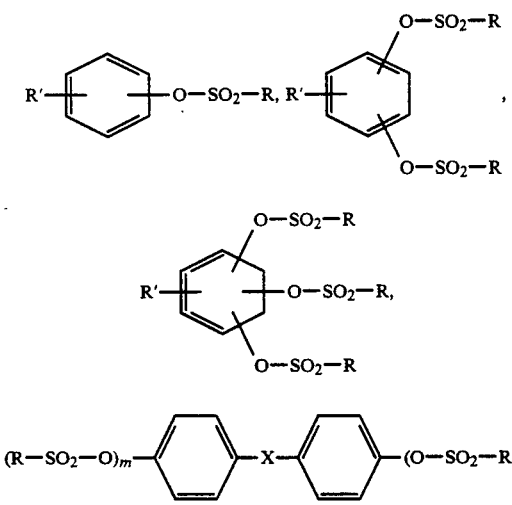

where m is 1 or 2, X is O, S or CR"$_2$, R and R' are each as defined above and R" is H, alkyl of 1 to 4 carbon atoms or halogen (e.g. chlorine).

Mixtures of the stated organic compounds (c) are also suitable.

The organic compounds (c) are present in the novel radiation-sensitive mixture in an amount of from 0.5 to 25, preferably from 1 to 15, % by weight, based on the total amount of components (a)+(b)+(c).

By adding the organic compound (c), all radiation-sensitive mixtures which are based on polymers containing acid-labile groups and onium salts, or on alkali-soluble polymers, low molecular weight organic compounds containing acid-labile groups and onium salts, can be improved with regard to their processing latitude between exposure and heating.

In the novel process for the production of relief patterns and relief images, a radiation-sensitive recording layer, which essentially consists of the novel radiation-sensitive mixture which has advantageously been dissolved in an inert solvent, for example methylpropylene glycol acetate, methylcellosolve acetate or ethylcellosolve acetate, is applied in a conventional manner, for example by spin coating, to a suitable substrate, such as a silicon wafer, in a layer thickness of from 0.2 to 4 μm, based on the dry layer, and dried, is heated at from 60° to 120° C. for from 5 seconds to 5 minutes and exposed to a dose such that the solubility of the exposed parts in aqueous alkaline solvents, for example alkaline developers of pH 10–14, containing alkali metal hydroxides, alkali metal silicates or amines, such as tetramethylammonium hydroxide, increases and these exposed parts can be selectively removed with the alkaline developer.

The mixtures have high sensitivity and contrast. Relief structures of good quality are formed.

Further information on the composition and further processing of radiation-sensitive mixtures can also be obtained, for example, from DE-A 37 21 741.

In the Examples which follow, parts and percentages are by weight, unless stated otherwise.

EXAMPLE 1

A photoresist solution is prepared from 15 parts of tris-(4-tert-butoxycarbonyloxyphenyl)-sulfonium trifluoromethanesulfonate, 5 parts of 1,2,3-tris-(methanesulfonyloxy)-benzene, 80 parts of poly-(p-vinylphenol) and 300 parts of methylpropylene glycol acetate. The solution is then filtered through a filter having a pore diameter of 0.2 μm.

This resist solution is applied by spin coating to a silicon wafer having an $SiO_2$ film in a layer thickness of about 1 μm. The wafer is dried for one minute at 90° C., then brought into contact with an imagewise structured test mask and exposed for 3 seconds to excimer laser light of wavelength 248 nm.

The wafer is then left for 1 hour (21° C., relative humidity in the room 45%) in order to simulate any waiting periods between the individual process steps.

The wafer is then heated for 1 minute at 90° C. and developed with an alkaline developer. The wafer can be satisfactorily developed to give a positive relief pattern and has the same structural quality as a comparative wafer which was heated directly after exposure.

No negative behavior is observed even when 10 times the exposure energy is used.

COMPARATIVE EXAMPLE 1

The procedure is similar to that in Example 1, except that the resist solution contains no tris-(methanesulfonyloxy)-benzene and instead contains 85 parts of polymer. After a storage time of one hour between exposure and heating, the resist pattern can no longer be developed with the developer used in Example 1.

EXAMPLE 2

A photoresist solution is prepared from 5 parts of tris-(4-tert-butoxycarbonyloxyphenyl)-sulfonium trifluoromethanesulfonate, 90 parts of poly-(p-vinylphenol-co-p-tert-butoxycarbonyloxystyrene) 9:1 (=poly(p-hydroxystyrene) in which 10% of the phenolic hydroxyl groups are protected by tert-butoxycarbonyl groups), 5 parts of 1,2,3-tris-(methanesulfonyloxy)-benzene and 300 parts of cyclohexanone. The solution is then filtered through a filter having a pore diameter of 0.2 μm.

This resist solution is applied to a silicon wafer in a layer thickness of about 1 μm and heated for 1 minute at 90° C. on a hotplate. Thereafter, imagewise exposure to excimer laser light of wavelength 248 nm is carried out for 4 seconds through a structured test mask by the contact method.

After exposure, half of the wafer is immediately heated for 1 minute at 90° C. and developed with an alkaline developer. After a development time of 33 seconds, the parts exposed to 90 mJ/cm$^2$ have been completely removed.

The other half of the wafer is left for 15 minutes after exposure in normal room air and then heated for 1 minute at 90° C. and developed. The development time is likewise 33 seconds.

COMPARATIVE EXAMPLE 2

The resist formulation used is as in Example 2 but, instead of sulfonium trifluoromethanesulfonate, it contains 95 parts of polymer. Coating, heating and exposure are carried out as in Example 2. One half of the wafer is heated immediately. The development time for an exposure of 90 mJ/cm$^2$ is 34 seconds. The other half of the wafer is left for 15 minutes after exposure before being heated. The development time increases to 62 seconds as a result.

COMPARATIVE EXAMPLE 3

The resist formulation used is as in Example 2 but, instead of 1,2,3-tris-(methanesulfonyloxy)-benzene, it contains 95 parts of polymer. Coating, heating and exposure are carried out as in Example 2. One half of the wafer is heated immediately. The development time for an exposure of 90 mJ/cm$^2$ is 34 seconds. The other half of the wafer is left for 15 minutes after exposure before being heated. The development time increases to 78 seconds as a result.

EXAMPLE 3

The procedure is similar to that in Example 1, except that 1,2,3-tris-(ethanesulfonyloxy)-benzene is used instead of the 1,2,3-tris-(methanesulfonyloxy)-benzene. The development results are identical to those of Example 1.

EXAMPLES 4 TO 6

The procedure is similar to that in Example 2, except that the compounds (c) below are employed.

| | Compound (c) | Storage time |
|---|---|---|
| (4) | 5% of 1,3,5-tris-(methanesulfonyloxy)-benzene | 15 min |
| (5) | 5% of 1,2-bis-(methanesulfonyloxy)-benzene | 20 min |
| (6) | 5% of 1,2,3-tris-(toluenesulfonyloxy)-benzene | 20 min |

During the stated storage times, no changes in the development behavior are observed and, after a heating step of 1 minute at 90° C., all resist patterns can still be developed without leaving any residue.

In the absence of the additives c), residual layers occur even after 10 minutes.

EXAMPLE 7

A photoresist solution is prepared from 10 parts of dimethyl-4-tert-butoxycarbonyloxyphenylsulfonium hexafluoroarsenate, 86 parts of poly-(vinylphenol-co-p-tert-amyloxycarbonyloxystyrene) 9:1 (=poly-(p-hydroxystyrene) in which 10% of the phenolic hydroxyl groups are protected by tert-amyloxycarbonyl groups), 4 parts of 1,2-di-(methanesulfonyloxy)-benzene and 300 parts of ethyl lactate and is filtered through a filter having a pore size of 0.2 μm.

The resist solution is applied in a layer thickness of about 1 μm to a wafer and exposed imagewise. Storage may then be effected for up to 15 minutes without the development behavior changing, whereas a comparative wafer without the sulfonate can no longer be developed completely within the development time of 60 seconds.

We claim:

1. A radiation-sensitive mixture containing
    (a) a polymeric binder which is insoluble in water but soluble in aqueous alkaline solutions,
    (b) a sulfonium salt of the formula (II)

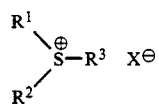

where $R^1$, $R^2$ and $R^3$ are identical or different and are aliphatic or aromatic radicals which may contain hetero atoms, or two of the radicals $R^1$ to $R^3$ are bonded to one another to form a ring, with the proviso that one or more of the radicals $R^1$ to $R^3$ contains one or more groups cleavable by an acid, and X is a nonnucleophilic counter-ion, and
    (c) one or more organic compounds of the formula (I)

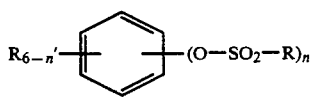

where R is alkyl of 1 to 8 carbon atoms, haloalkyl of 1 to 8 carbon atoms, aryl of 6 to 18 carbon atoms or alkyl-, halogen- or $NO_2$-substituted aryl, the radicals R' are identical or different and are each hydrogen, alkyl of 1 to 8 carbon atoms, alkoxy of 1 to 8 carbon atoms or

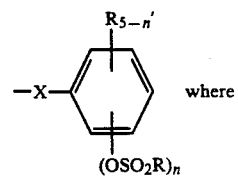

X is —O—, —S— or —($CR''_2$)$_m$—, R'' is H, alkyl of 1 to 4 carbon atoms or halogen, n is 1, 2 or 3 and m is from 0 to 8.

2. A radiation-sensitive mixture as defined in claim 1, wherein an alkyl sulfonate of pyrocatechol, resorcinol, hydroquinone, pyrogallol, phloroglucinol, hydroxyhydroquinone or a mixture of these alkyl sulfonates is used as the organic compound (c) of the formula (I).

3. A radiation-sensitive mixture as defined in claim 1, wherein the organic compound (c) is present in an amount of from 0.5 to 25% by weight, based on the total amount of radiation-sensitive mixture (a)+(b)+(c).

4. A radiation-sensitive mixture as defined in claim 1, wherein component (b) is present in the radiation-sensitive mixture in an amount of from 0.5 to 20% by weight, based on the total amount of radiation-sensitive mixture (a)+(b)+(c).

5. A radiation-sensitive mixture as defined in claim 1, wherein one of the radicals $R^1$ to $R^3$ is bonded to one or more further sulfonium salt radicals.

6. A radiation-sensitive mixture as defined in claim 1, wherein one of the radicals $R^1$ to $R^3$ is bonded to one or more further sulfonium salt radicals via groups cleavable by an acid.

7. A radiation-sensitive mixture as defined in claim 1, wherein said sulfonium slat (b) of the formula (II) is a dimethyl-4-tert-butoxycarbonyloxyphenylsulfonium salt with hexafluoroarsenate, hexafluoroantimonate, hexafluorophosphate, hexafluoroborate or trifluoromethanesulfonate as a counter-ion, a phenyl-bis-(4-tert-butoxycarbonyloxyphenyl)-sulfonium salt with the stated counter-ions; a tris-(4-tert-butoxycarbonyloxyphenyl)-sulfonium salt with the stated counter-ions or a 1-naphthyl-4-trimethylsilyloxytetramethylenesulfonium salt with the stated counter-ions.

8. A radiation-sensitive mixture as defined in claim 7, wherein the compound (c) of the formula (I) is an alkyl sulfonate of pyrocatechol, resorcinol, hydroquinone, pyrogallol, phloroglucinol, hydroxyhydroquinone or a mixture of these alkyl sulfonates.

9. In a process for the production of a relief pattern or relief image comprising the steps of 1) providing a photosensitive coating material which is a radiation-sensitive recording layer, 2) imagewise exposing the radiation-sensitive recording layer to irradiation, and 3) selectively removing the exposed parts of the recording layer with an alkaline developer so that the unexposed parts of the recording layer are left, the improvement which comprises utilizing as the radiation-sensitive recording layer the mixture described in claim 1.

10. A process for the production of a relief pattern as defined in claim 9, wherein exposure of the radiation-sensitive mixture is followed by heating at from 60° C. to 120° C.

* * * * *

UNITED STATES PATENT AND TRADEMARK OFFICE
CERTIFICATE OF CORRECTION

PATENT NO.: 5,318,876

DATED: June 7, 1994

INVENTOR(S): SCHWALM et al.

It is certified that error appears in the above-identified patent and that said Letters Patent is hereby corrected as shown below:

Column 10, claim 7, line 35, "sulfonium slat" should be --sulfonium salt--.

Signed and Sealed this

Twenty-seventh Day of September, 1994

BRUCE LEHMAN

*Attest:*

*Attesting Officer*          *Commissioner of Patents and Trademarks*